United States Patent
Yi et al.

(10) Patent No.: US 11,699,730 B2
(45) Date of Patent: Jul. 11, 2023

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Liang Yi, Singapore (SG); Zhiguo Li, Singapore (SG); Xiaojuan Gao, Singapore (SG); Chi Ren, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 17/510,371

(22) Filed: Oct. 25, 2021

(65) Prior Publication Data

US 2023/0029468 A1    Feb. 2, 2023

(30) Foreign Application Priority Data

Aug. 2, 2021 (TW) .................. 110128305

(51) Int. Cl.
*H01L 29/423* (2006.01)
*H01L 29/66* (2006.01)
*H01L 21/28* (2006.01)
*H01L 29/788* (2006.01)

(52) U.S. Cl.
CPC .. *H01L 29/42328* (2013.01); *H01L 29/40114* (2019.08); *H01L 29/66825* (2013.01); *H01L 29/7883* (2013.01)

(58) Field of Classification Search
CPC ......... H01L 29/42328; H01L 29/40114; H01L 29/66825; H01L 29/7883; H01L 27/11517–1156; H01L 29/788–7889; H01L 29/42324–42336; H01L 21/28247; H01L 21/76834; G11C 16/0408–0458; G11C 11/5621–5642; G11C 2216/06–10; H10B 41/00–70
See application file for complete search history.

(56) References Cited

U.S. PATENT DOCUMENTS

| | | | |
|---|---|---|---|
| 9,583,640 B1* | 2/2017 | Richter | H01L 29/42332 |
| 9,627,392 B2 | 4/2017 | Chuang | |
| 9,812,460 B1 | 11/2017 | Wu | |
| 10,276,587 B2 | 4/2019 | Wu | |
| 2006/0068529 A1 | 3/2006 | Chen | |
| 2011/0076816 A1* | 3/2011 | Liu | H01L 29/7883 |
| | | | 257/E21.409 |
| 2017/0062443 A1* | 3/2017 | Mizushima | H01L 27/11534 |
| 2017/0194056 A1* | 7/2017 | Heinrich-Barna | G11C 16/0425 |
| 2019/0148513 A1 | 5/2019 | Lin | |
| 2020/0176460 A1* | 6/2020 | Decobert | H01L 29/42328 |

* cited by examiner

*Primary Examiner* — Shahed Ahmed
(74) *Attorney, Agent, or Firm* — Winston Hsu

(57) ABSTRACT

A semiconductor memory device includes a substrate; a source diffusion region in the substrate; a pair of floating gates disposed on opposite of the source diffusion region; a first dielectric cap layer disposed directly on each of the floating gates; an erase gate disposed on the source diffusion region and partially overlapping an upper inner corner of each of the floating gates; a second dielectric cap layer disposed on the erase gate and the first dielectric cap layer; a select gate disposed on a sidewall of the first dielectric cap layer; and a drain diffusion region disposed in the substrate and adjacent to the select gate.

11 Claims, 8 Drawing Sheets

SEMICONDUCTOR MEMORY DEVICE AND FABRICATION METHOD THEREOF

BACKGROUND OF THE INVENTION

1. Field of the Invention

The present invention relates to the field of semiconductor technology, and particularly relates to a semiconductor memory device and a manufacturing method thereof.

2. Description of the Prior Art

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule-of integration of semiconductor processing decreases, reducing the smallest lithographic feature, the need for precise alignment becomes more critical. Alignment of various parts also determines the yield of the manufacturing of the semiconductor products.

The disadvantage of the prior art is that the select gate and control gate of the split gate memory cell need to be defined by different lithography and etching processes respectively, which leads to overlay shift and poor control of channel length.

SUMMARY OF THE INVENTION

It is one object of the present invention to provide an improved semiconductor memory device and a manufacturing method thereof to solve the above-mentioned shortcomings or deficiencies of the prior art.

One aspect of the invention provides a semiconductor memory device including a substrate; a source diffusion region in the substrate; a pair of floating gates disposed on opposite of the source diffusion region; a first dielectric cap layer disposed directly on each of the floating gates; an erase gate disposed on the source diffusion region and partially overlapping an upper inner corner of each of the floating gates; a second dielectric cap layer disposed on the erase gate and the first dielectric cap layer; a select gate disposed on a sidewall of the first dielectric cap layer; and a drain diffusion region disposed in the substrate and adjacent to the select gate.

According to some embodiments, the erase gate has a T shaped profile comprising a horizontal upper portion and a vertical lower portion connecting to the horizontal upper portion.

According to some embodiments, the horizontal upper portion is in direct contact with a curved surface of the first dielectric cap layer.

According to some embodiments, the horizontal upper portion of the erase gate has a curved edge that conforms to the curved surface of the first dielectric cap layer.

According to some embodiments, the semiconductor memory device further includes a tunnel oxide layer disposed between the erase gate and each of the floating gates.

According to some embodiments, the tunnel oxide layer wraps around the upper inner corner of each of the floating gates.

According to some embodiments, the first dielectric cap layer is in direct contact with each of the floating gates and is in direct contact with the second dielectric cap layer.

According to some embodiments, the semiconductor memory device further includes a floating gate oxide layer disposed between the floating gate and the substrate; and a select gate oxide layer disposed between the select gate and the substrate.

According to some embodiments, the semiconductor memory device further includes an insulating layer disposed between the floating gate and the select gate.

According to some embodiments, each of the floating gates is a polysilicon floating gate.

According to some embodiments, the select gate has a curved outer surface.

According to some embodiments, the select gate comprises an inner sidewall and an outer sidewall, and a non-planar top surface between the inner sidewall and the outer sidewall, wherein the non-planar top surface comprises a first surface region descending from the inner sidewall to the outer sidewall, and a second surface region between the first surface region and the outer sidewall, wherein a slope of the second surface region is greater than that of the first surface region.

According to some embodiments, the non-planar top surface further comprises a third surface region connecting the second surface region with the outer sidewall, wherein the second surface region, the third surface region and the outer sidewall constitute a step structure.

Another aspect of the invention provides a method for forming a semiconductor memory device. A substrate is provided. A source diffusion region is formed in the substrate. Two floating gates are on opposite sides of the source diffusion region. A first dielectric cap layer is formed directly on each of the floating gates. An erase gate is formed on the source diffusion region. The erase gate partially overlaps an upper inner corner of each of the floating gates. A second dielectric cap layer is formed on the erase gate and the first dielectric cap layer. A select gate is formed on a sidewall of the first dielectric cap layer in a self-aligned manner. A drain diffusion region is formed in the substrate and adjacent to the select gate.

According to some embodiments, the erase gate has a T shaped profile comprising a horizontal upper portion and a vertical lower portion connecting to the horizontal upper portion.

According to some embodiments, the horizontal upper portion is in direct contact with a curved surface of the first dielectric cap layer.

According to some embodiments, the horizontal upper portion of the erase gate has a curved edge that conforms to the curved surface of the first dielectric cap layer.

According to some embodiments, a tunnel oxide layer is formed between the erase gate and each of the floating gates.

According to some embodiments, the tunnel oxide layer wraps around the upper inner corner of each of the floating gates.

According to some embodiments, the first dielectric cap layer is in direct contact with each of the floating gates and is in direct contact with the second dielectric cap layer.

According to some embodiments, a floating gate oxide layer is formed between the floating gate and the substrate, and a select gate oxide layer is formed between the select gate and the substrate.

According to some embodiments, an insulating layer is formed between the floating gate and the select gate.

According to some embodiments, each of the floating gates is a polysilicon floating gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
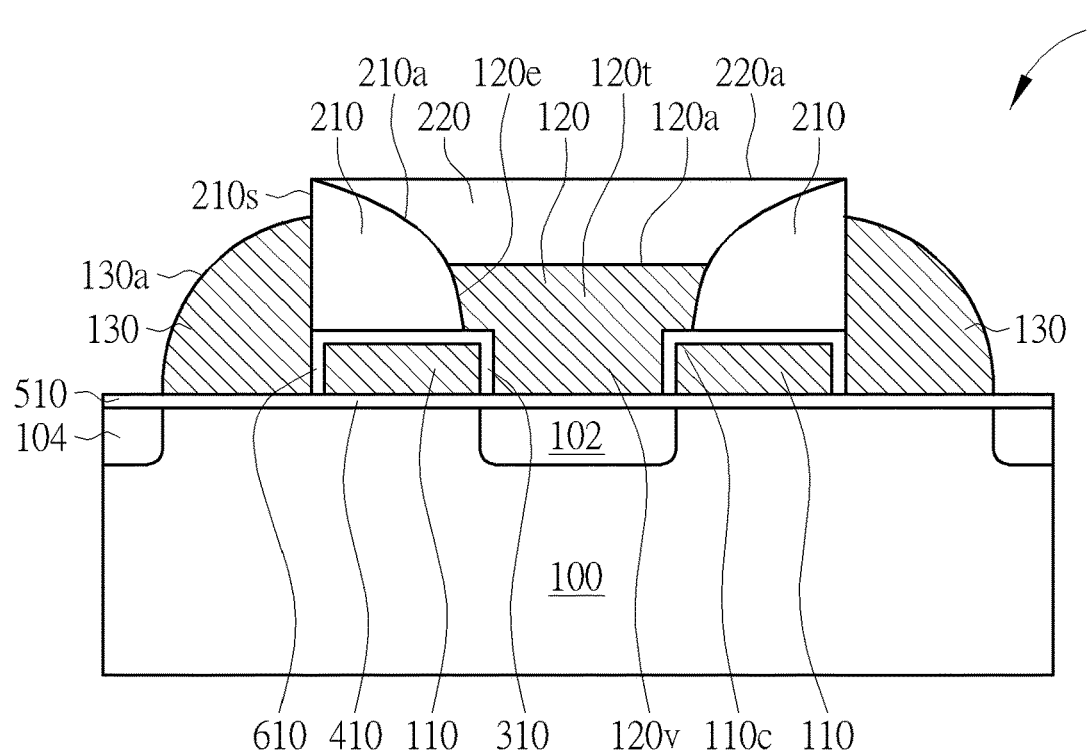
FIG. 1 is a schematic cross-sectional view of a semiconductor memory device according to an embodiment of the invention.

Please refer to FIG. 1, which is a schematic cross-sectional view of a semiconductor memory device according to an embodiment of the present invention. As shown in FIG. 1, the semiconductor memory device 1 includes a substrate 100, for example, a semiconductor substrate. A source diffusion region 102 is provided in the substrate 100. Two floating gates 110 are provided on the substrate 100 on opposite sides of the source diffusion region 102. According to an embodiment of the present invention, each of the two floating gates 110 may be a polysilicon floating gate.

According to an embodiment of the present invention, a first dielectric cap layer 210 is directly disposed on each floating gate 110. For example, the first dielectric cap layer 210 may be a silicon oxide layer, but is not limited thereto. According to an embodiment of the present invention, the first dielectric cap layer 210 has an arc-shaped or curved surface 210a. An erase gate 120 is disposed directly above the source diffusion region 102, and the erase gate 120 partially overlaps an upper inner corner 110c of each floating gate 110

According to an embodiment of the present invention, the erase gate 120 has a T-shaped profile, including a horizontal upper portion 120t and a vertical lower portion 120v connected to the horizontal upper portion 120t. According to an embodiment of the present invention, the horizontal upper portion 120t directly contacts the curved surface 210a of the first dielectric cap layer 210. According to an embodiment of the present invention, the horizontal upper portion 120t of the erase gate 120 has a curved edge 120e, which conform to the contour of the curved surface 210a of the first dielectric cap layer 210. According to an embodiment of the present invention, the upper surface 120a of the erase gate 120 and the curved surface 210a of the first dielectric cap layer 210 constitute a recessed region. According to an embodiment of the present invention, the semiconductor memory device 1 has a mirror-symmetrical structure with respect to the erase gate 120.

According to an embodiment of the present invention, a second dielectric cap layer 220 is provided on the erase gate 120 and the first dielectric cap layer 210. According to an embodiment of the present invention, the second dielectric cap layer 220 completely fills the recessed region formed by the upper surface 120a of the erase gate 120 and the curved surface 210a of the first dielectric cap layer 210. According to an embodiment of the present invention, the first dielectric cap layer 210 directly contacts each floating gate 110 and directly contacts the second dielectric cap layer 210. For example, the second dielectric cap layer 220 may be a silicon oxide layer, but is not limited thereto. According to an embodiment of the present invention, the second dielectric cap layer 220 has a flat upper surface 220a.

According to an embodiment of the present invention, a select gate 130 is provided on a sidewall 210s of the first dielectric cap layer 210. According to an embodiment of the present invention, the select gate 130 has an arc-shaped outer surface 130a. According to an embodiment of the present invention, a drain diffusion region 104 is provided in the substrate 100, and the drain diffusion region 104 is adjacent to the select gate 130.

According to an embodiment of the present invention, the semiconductor memory device 1 further includes a tunnel oxide layer 310 disposed between the erase gate 120 and each floating gate 110. For example, the tunnel oxide layer 310 may be a silicon oxide layer, but is not limited thereto. According to an embodiment of the present invention, the tunnel oxide layer 310 wraps around the upper inner corner 110c of each floating gate 110.

According to an embodiment of the present invention, the semiconductor memory device 1 further includes a floating gate oxide layer 410 disposed between the floating gate 110 and the substrate 100. According to an embodiment of the present invention, the semiconductor memory device 1 further includes a select gate oxide layer 510 disposed between the select gate 130 and the substrate 100. According to an embodiment of the present invention, the semiconductor memory device 1 further includes an insulating layer 610 disposed between the floating gate 110 and the select gate 130. For example, the insulating layer 610 may be a silicon oxide layer, but is not limited thereto.

Figure 2:
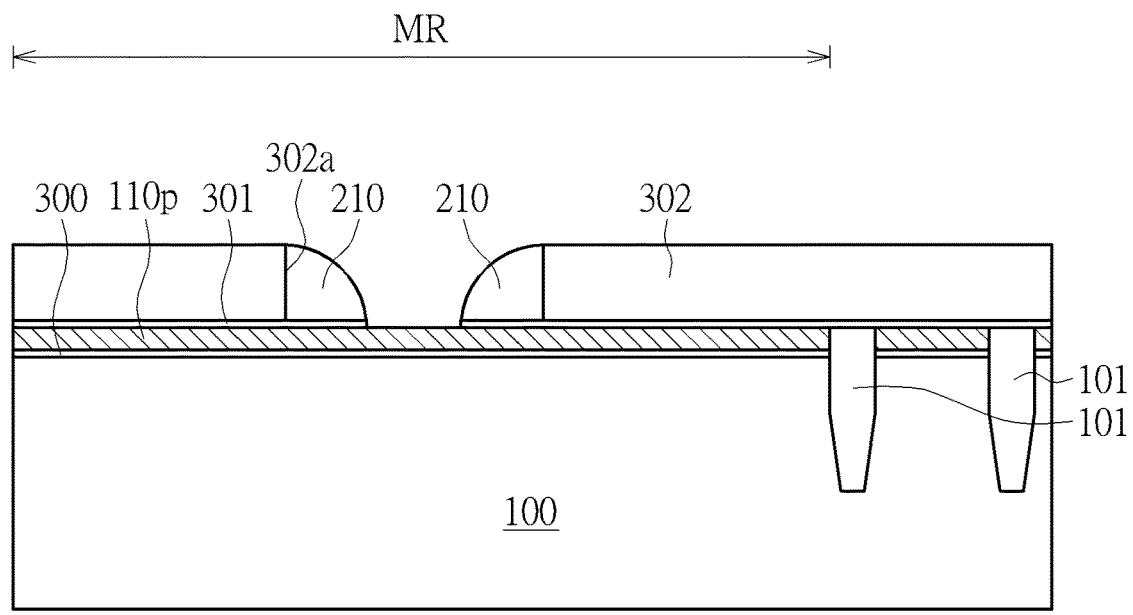
FIG. 2 to FIG. 11 are schematic diagrams showing a method of forming a semiconductor memory device according to an embodiment of the present invention.

Please refer to FIG. 2 to FIG. 11, which are schematic diagrams showing a method of forming a semiconductor memory device according to an embodiment of the present invention. As shown in FIG. 2, the substrate 100 includes a memory array area MR, and the semiconductor memory device of the present invention will be formed in the memory array area MR. A trench isolation structure 101 is provided in the substrate 100, and the upper end of the trench isolation structure 101 protrudes from the surface of the substrate 100. A tunnel oxide layer 300 and a polysilicon layer 110p are formed on the substrate 100, and then the polysilicon layer 110p is planarized by a chemical mechanical polishing (CMP) process so that the upper surface of the polysilicon layer 110p is approximately flush with the trench isolation structure 101.

Subsequently, a pad oxide layer 301 is formed on the polysilicon layer 110p. A patterned hard mask layer 302 is then formed on the pad oxide layer 301. The patterned hard mask layer 302 may be a silicon nitride layer, but it is not limited thereto. The patterned hard mask layer 302 has an opening 302a. Next, a first dielectric cap layer 210 is formed on the sidewall of the opening 302a in a self-aligned manner. To form the first dielectric cap layer 210, a dielectric layer, for example, a silicon oxide layer, is deposited in a blanket manner, and then the dielectric layer is etched back.

Figure 3:
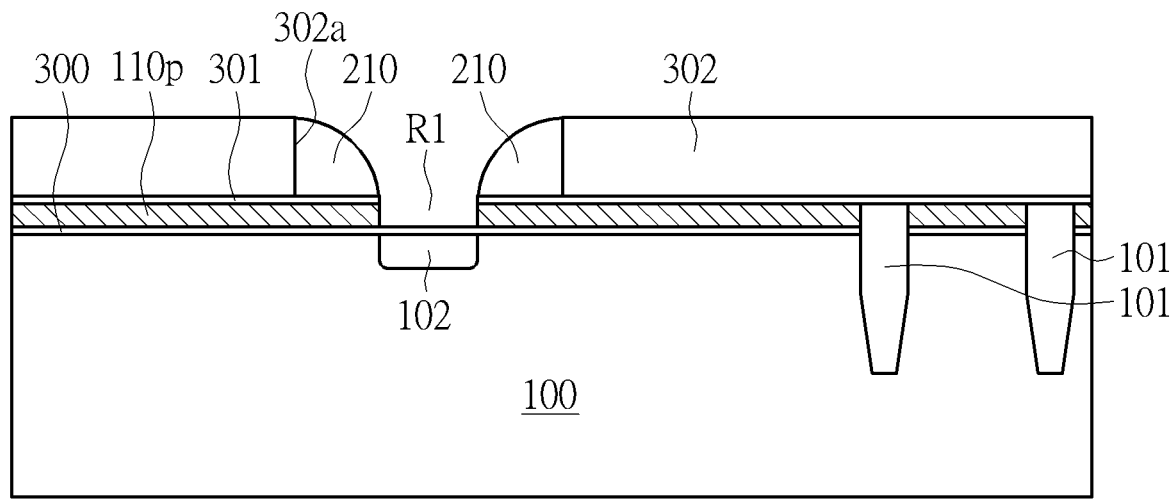

As shown in FIG. 3, next, using the first dielectric cap layer 210 and the hard mask layer 302 as the etching hard mask layer, an anisotropic dry etching process is performed to etch the exposed pad oxide layer 301 and the polysilicon layer 110p until the tunnel oxide layer 300 is exposed, so that a recessed region R1 is formed between the first dielectric cap layers 210. Next, an ion implantation process can be performed to form the source diffusion region 102 in the substrate 100.

Figure 4:
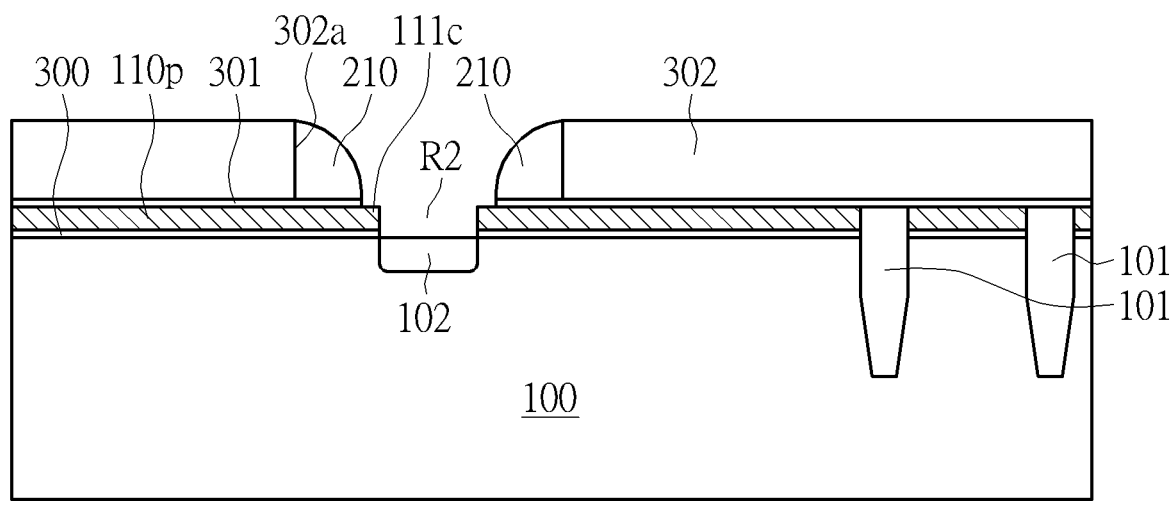

As shown in FIG. 4, a wet etching process is then performed to etch away the exposed tunnel oxide layer 300 and part of the first dielectric cap layer 210, thus forming a recessed region R2. At this point, the upper inner corner 110c of the polysilicon layer 110p will be exposed in the recessed region R2.

Figure 5:
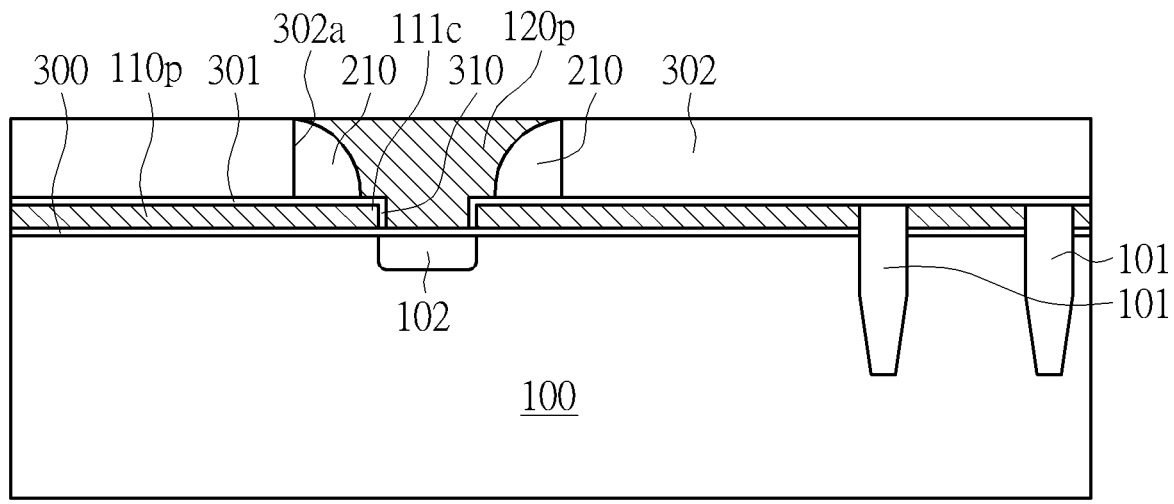

As shown in FIG. 5, an oxidation process is then performed to form a tunnel oxide layer 310 on the surface of the polysilicon layer 110p exposed in the recessed region R2. Subsequently, a polysilicon layer 120p is deposited on the substrate 100 to fill the recessed region R2. The polysilicon layer 120p is then planarized by a CMP process until the hard mask layer 302 is exposed. At this point, the upper surface of the polysilicon layer 120p is approximately flush with the upper surface of the hard mask layer 302.

Figure 6:
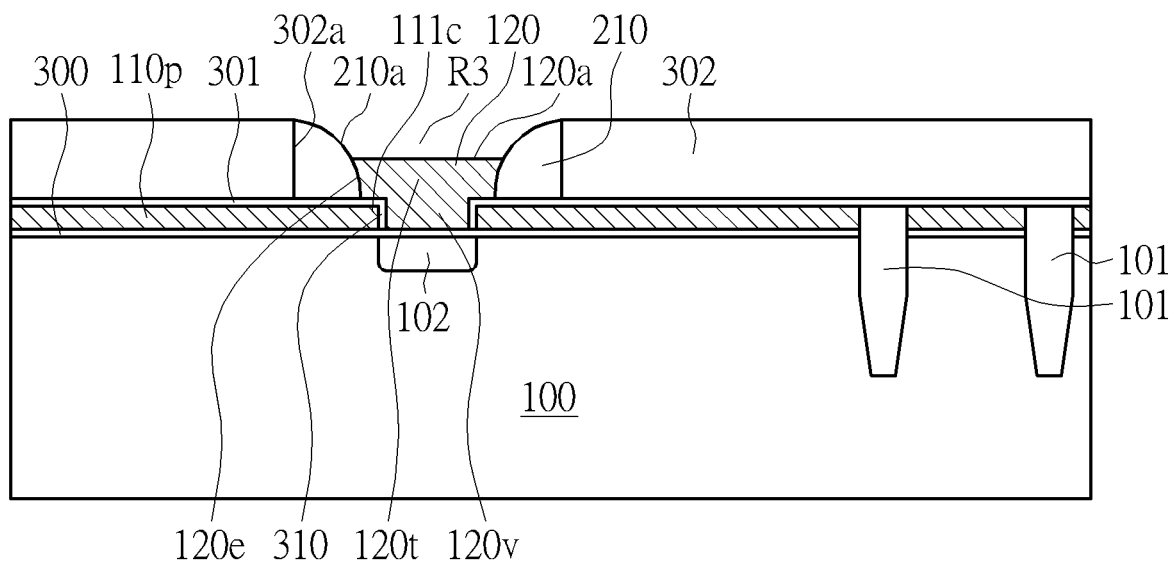

As shown in FIG. 6, next, an etch-back process is performed to remove a part of the thickness of the polysilicon layer 120p, thus forming an erase gate 120. The upper surface 120a of the erase gate 120 and the curved surface 210a of the first dielectric cap layer 210 constitute a recessed region R3. According to an embodiment of the present invention, the erase gate 120 has a T-shaped profile, including a horizontal upper portion 120t and a vertical lower portion 120v connected to the horizontal upper portion 120t. According to an embodiment of the present invention, the horizontal upper portion 120t directly contacts the curved surface 210a of the first dielectric cap layer 210. According to an embodiment of the present invention, the horizontal upper portion 120t of the erase gate 120 has a curved edge 120e, which is consistent with the contour of the curved surface 210a of the first dielectric cap layer 210.

Figure 7:
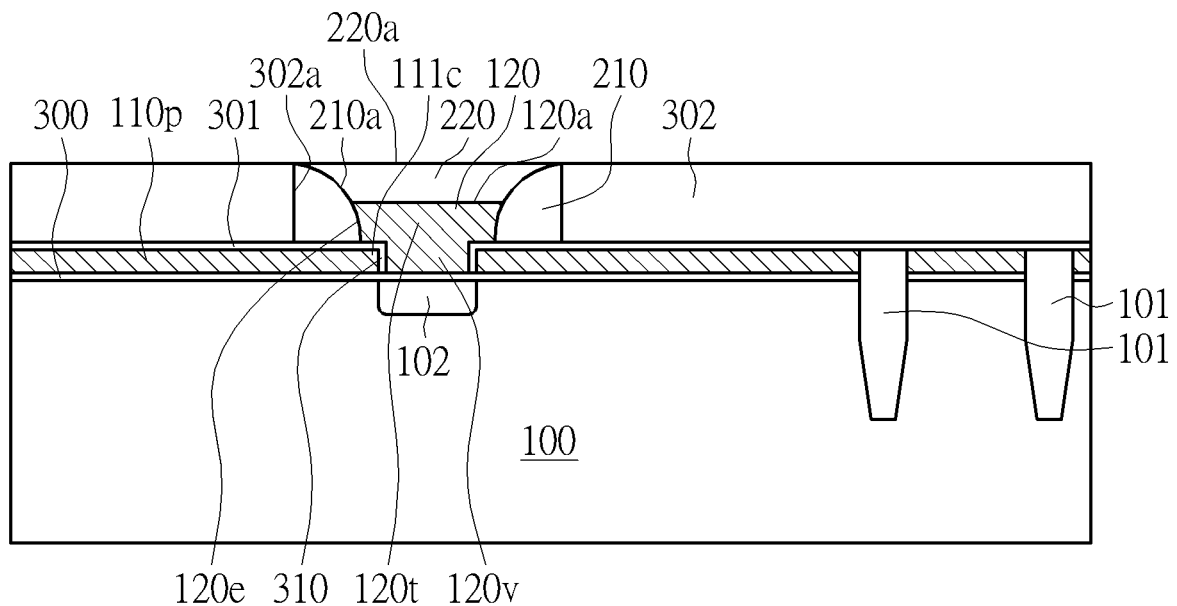

As shown in FIG. 7, next, a chemical vapor deposition (CVD) process is performed to deposit a silicon oxide layer on the substrate 100, and then the silicon oxide layer is planarized by a CMP process until the hard mask layer 302 is exposed. In this way, the recessed region R3 is completely filled with the second dielectric cap layer 220. According to an embodiment of the present invention, the first dielectric cap layer 210 directly contacts the second dielectric cap layer 210. According to an embodiment of the present invention, the second dielectric cap layer 220 has a flat upper surface 220a.

Figure 8:
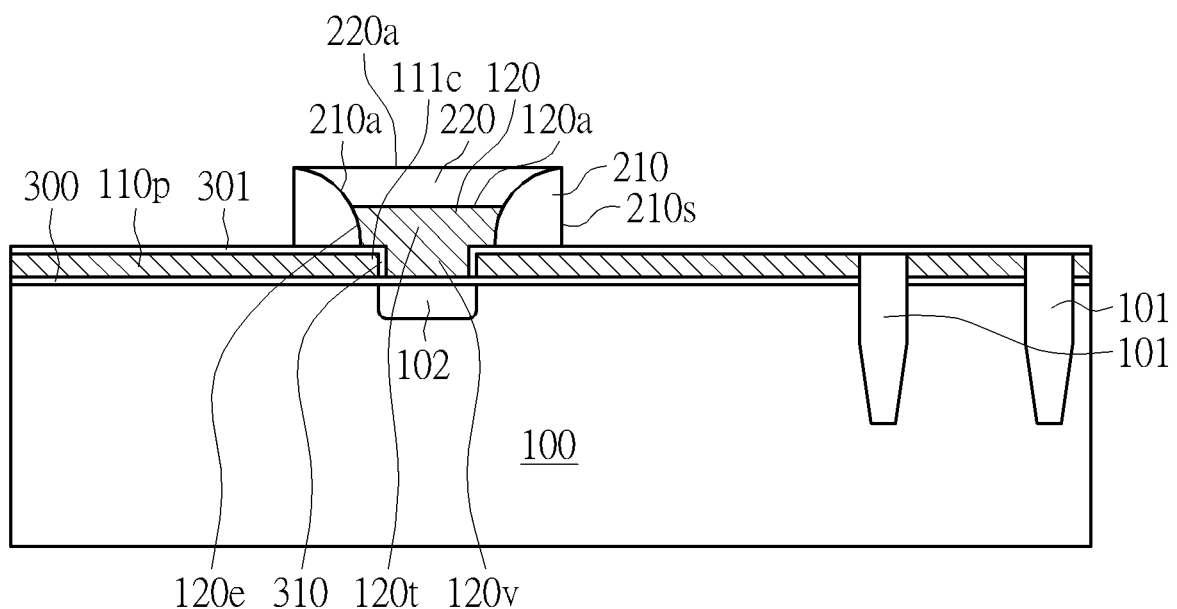

As shown in FIG. 8, next, the hard mask layer 302 is removed, and the pad oxide layer 301 and the sidewalls 210s of the first dielectric cap layer 210 are exposed.

Figure 9:
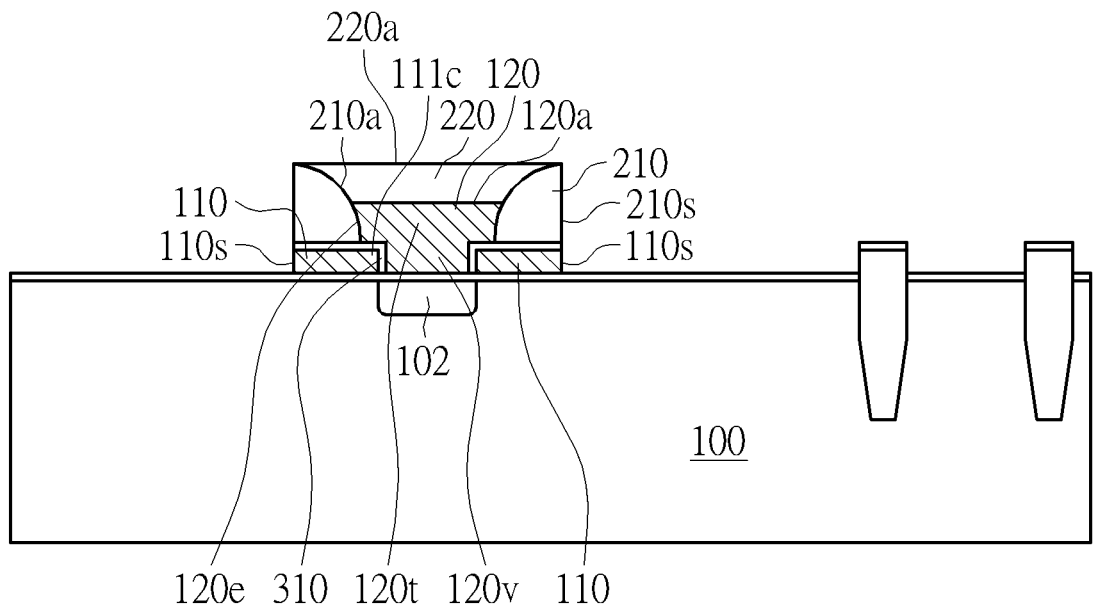

As shown in FIG. 9, next, using the second dielectric cap layer 220 and the first dielectric cap layer 210 as the etching hard mask layer, an anisotropic dry etching process is performed to etch away the pad oxide layer 301 and the polysilicon layer 110p not covered by second dielectric cap layer 220 and the first dielectric cap layer 210, thereby forming a pair of floating gates 110 on the substrate 100 on opposite sides of the source diffusion region 102. At this point, the sidewall 110s of the floating gate 110 opposite to the source diffusion region 102 is exposed.

Figure 10:
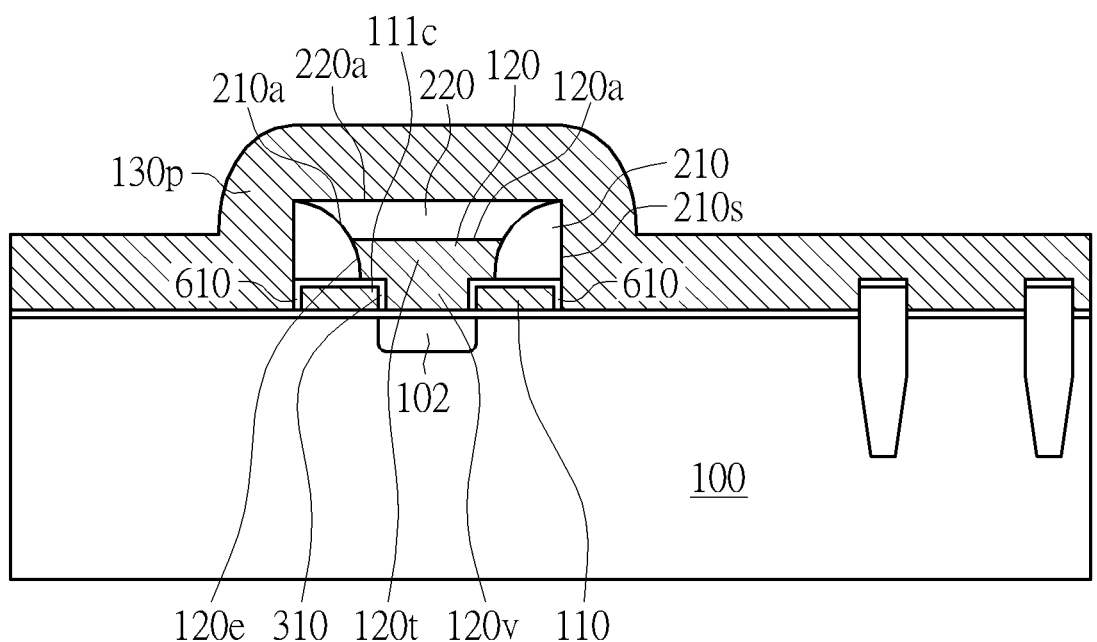

As shown in FIG. 10, an oxidation process is then performed to form an insulating layer 610, for example, a silicon oxide layer, on the exposed sidewall 102s of the floating gate 110. Then, a polysilicon layer 130p is deposited on the substrate 100 in a blanket manner. The polysilicon layer 130p conformally covers the insulating layer 610, the second dielectric cap layer 220, and the first dielectric cap layer 210.

Figure 11:
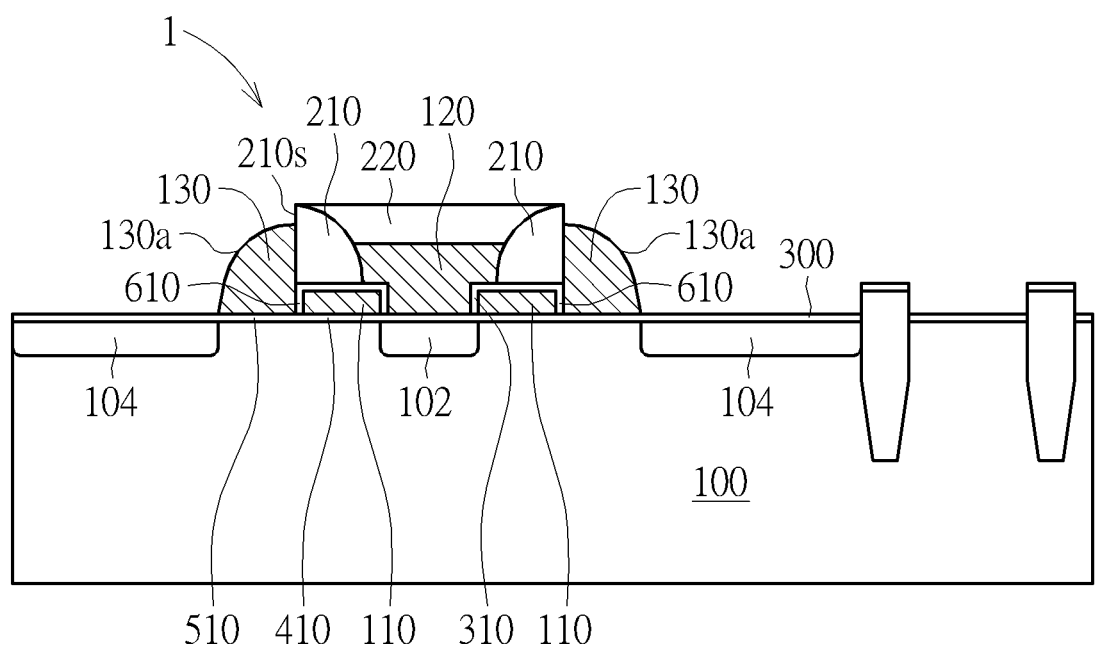

As shown in FIG. 11, then, an etch-back process, for example, an anisotropic dry etching process is performed to etch back the polysilicon layer 130p until the tunnel oxide layer 300 is exposed, thereby forming select gate 130 on the sidewall 210s of the first dielectric cap layer 210. According to an embodiment of the present invention, the select gate 130 has an arc-shaped outer surface 130a. Finally, an ion implantation process is performed to form the drain diffusion region 104 in the substrate 100, and the formation of the semiconductor memory device 1 is completed. According to an embodiment of the present invention, the drain diffusion region 104 is adjacent to the select gate 130. According to an embodiment of the present invention, the tunnel oxide layer 300 forms a selective gate oxide layer 510 between the selective gate 130 and the substrate 100, and forms a floating gate oxide layer 410 between the floating gate 110 and the substrate 100.

Figure 12:
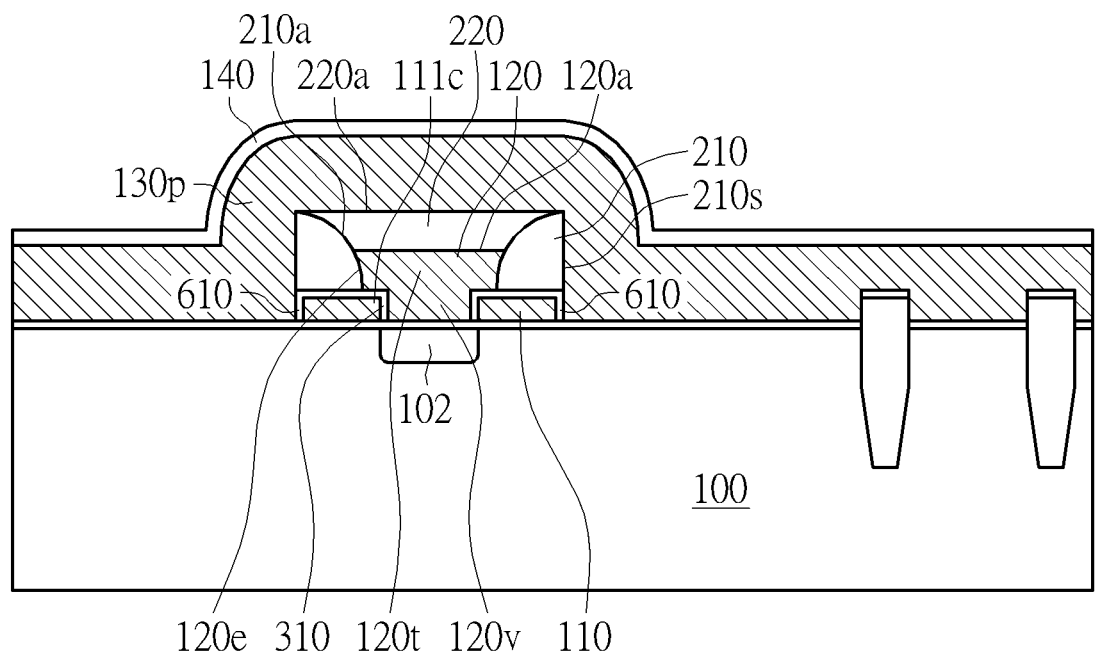
FIG. 12 to FIG. 14 are schematic diagrams showing a method of forming a semiconductor memory device according to another embodiment of the present invention.
Figure 13:
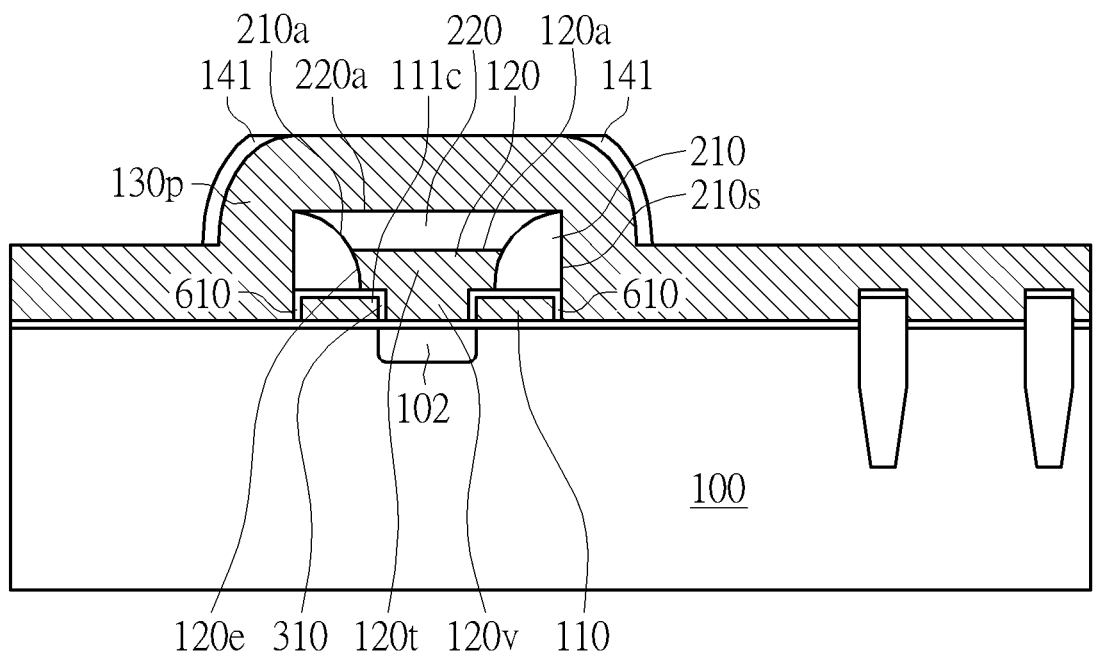
Figure 14:
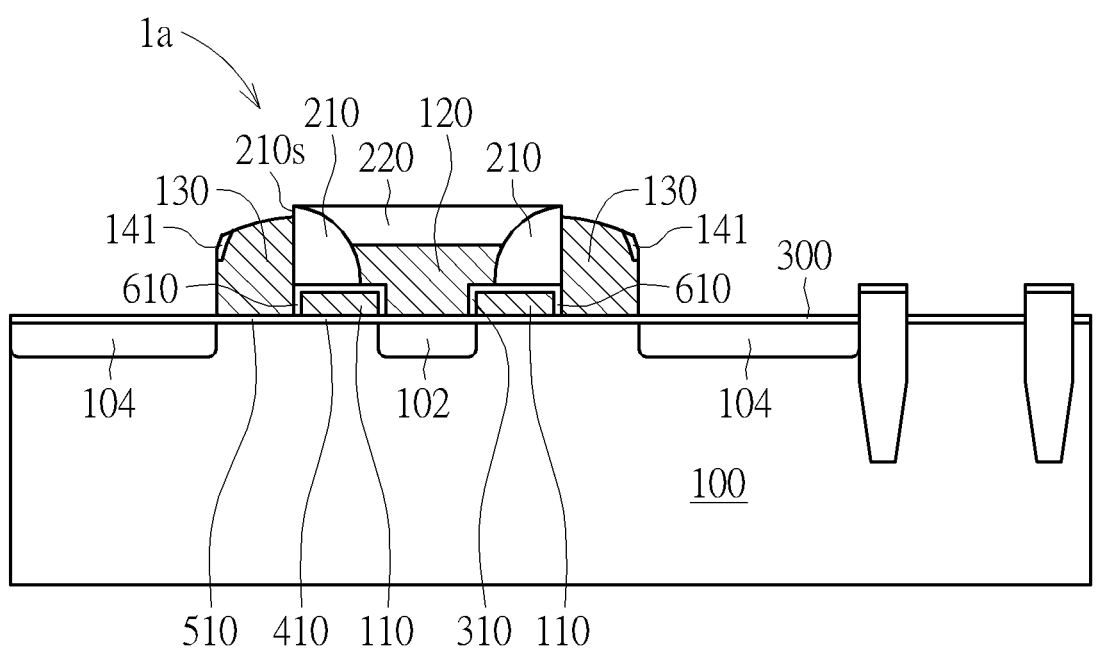

Please refer to FIG. 12 to FIG. 14, which are schematic diagrams showing a method of forming a semiconductor memory device according to another embodiment of the present invention. As shown in FIG. 12, following FIG. 10, after depositing a polysilicon layer 130p on the substrate 100 in a blanket manner, a hard mask layer 140, for example, a silicon oxide layer is deposited on the polysilicon layer 130p. According to an embodiment of the present invention, the thickness of the hard mask layer 140 is about 80-120 angstroms, for example, 100 angstroms, but is not limited thereto.

As shown in FIG. 13, the hard mask layer 140 is selectively etched back, thus forming spacers 141 on the polysilicon layer 130p.

As shown in FIG. 14, the polysilicon layer 130p is then selectively etched back until the tunnel oxide layer 300 is exposed, so that a select gate 130 is formed on the sidewall 210s of the first dielectric cap layer 210. Finally, an ion implantation process is performed to form the drain diffusion region 104 in the substrate 100, and the formation of the semiconductor memory device 1a is completed.

Figure 15:
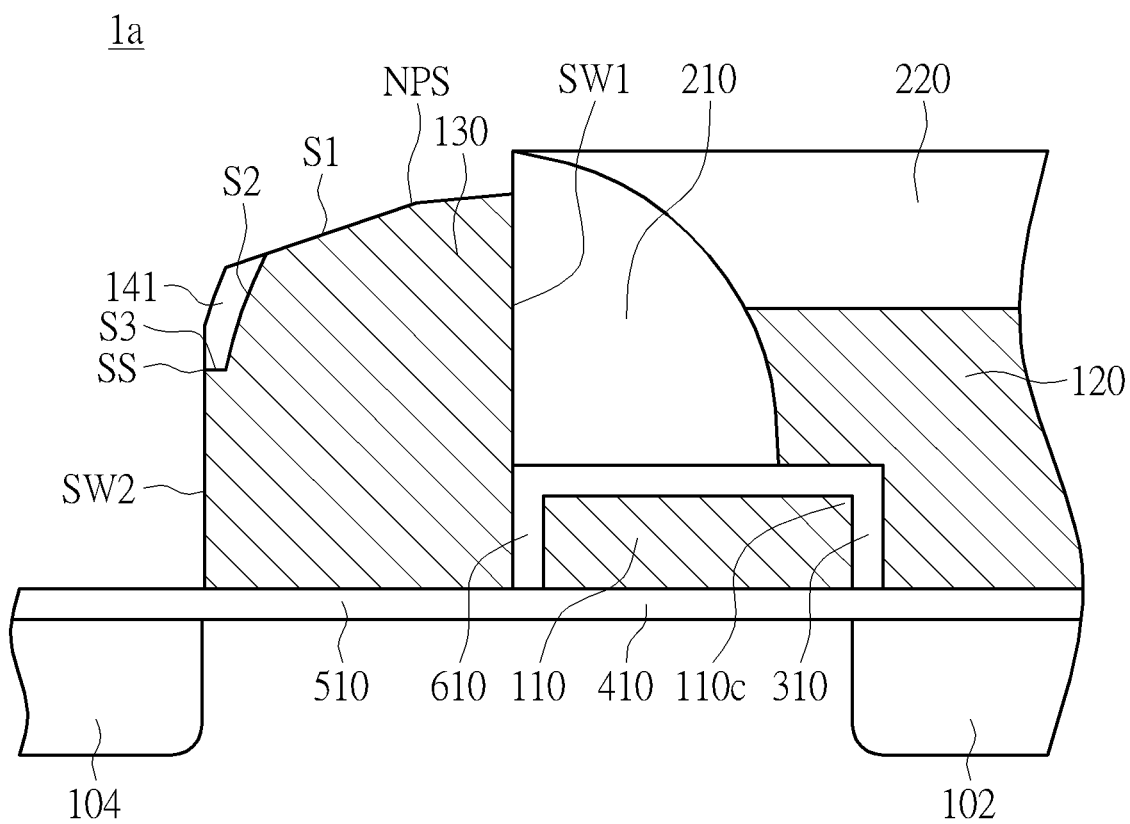
FIG. 15 is a partially enlarged view of the semiconductor memory device in FIG. 14.

Please refer to FIG. 15, which is a partially enlarged view of the semiconductor memory device 1a in FIG. 14, wherein like regions, elements or layers are designated by like numeral numbers or labels. As shown in FIG. 15, according to an embodiment of the present invention, the select gate 130 includes an inner sidewall SW1 and an outer sidewall SW2, and a non-planar top surface NPS located between the inner sidewall SW1 and the outer sidewall SW2. The non-planar top surface NPS includes a first surface region S1 descending from the inner sidewall SW1 to the outer sidewall SW2, and a second surface region S2 between the first surface region S1 and the outer sidewall SW2. The slope of the second surface region S2 is greater than the slope of the first surface region S1.

According to an embodiment of the present invention, the non-planar top surface NPS further includes a third surface region S3 connecting the second surface region S2 and the outer sidewall SW2. The second surface region S2, the third surface region S3 and the outer sidewall SW2 constitute a step structure SS.

It is one advantage of the present invention that the select gate 130 is formed in a self-aligned manner, so a photomask can be spared, the production cost can be reduced, and the manufacturing process steps are more simplified. By forming the select gate 130 in a self-aligned manner, the problems of overlay shift and channel length control can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a source diffusion region in the substrate;
   a pair of floating gates disposed on opposite of the source diffusion region;
   a first dielectric cap layer disposed directly on each of the floating gates, wherein the first dielectric cap layer has a curved surface;
   an erase gate disposed on the source diffusion region and partially overlapping an upper inner corner of each of the floating gates, wherein the erase gate has a T shaped profile comprising a horizontal upper portion and a vertical lower portion connecting to the horizontal upper portion, wherein the horizontal upper portion is in direct contact with a lower part of the curved surface of the first dielectric cap layer;
   a second dielectric cap layer disposed on the erase gate and the first dielectric cap layer;
   a select gate disposed on a sidewall of the first dielectric cap layer; and
   a drain diffusion region disposed in the substrate and adjacent to the select gate.

2. The semiconductor memory device according to claim 1, wherein the horizontal upper portion of the erase gate has a curved edge that conforms to the curved surface of the first dielectric cap layer.

3. The semiconductor memory device according to claim 1 further comprising:
   a tunnel oxide layer disposed between the erase gate and each of the floating gates.

4. The semiconductor memory device according to claim 3, wherein the tunnel oxide layer wraps around the upper inner corner of each of the floating gates.

5. The semiconductor memory device according to claim 1, wherein the first dielectric cap layer is in direct contact with each of the floating gates and is in direct contact with the second dielectric cap layer.

6. The semiconductor memory device according to claim 1 further comprising:
   a floating gate oxide layer disposed between the floating gate and the substrate; and
   a select gate oxide layer disposed between the select gate and the substrate.

7. The semiconductor memory device according to claim 1 further comprising:
   an insulating layer disposed between the floating gate and the select gate.

8. The semiconductor memory device according to claim 1, wherein each of the floating gates is a polysilicon floating gate.

9. The semiconductor memory device according to claim 1, wherein the select gate has a curved outer surface.

10. The semiconductor memory device according to claim 1, wherein the select gate comprises an inner sidewall and an outer sidewall, and a non-planar top surface between the inner sidewall and the outer sidewall, wherein the non-planar top surface comprises a first surface region descending from the inner sidewall to the outer sidewall, and a second surface region between the first surface region and the outer sidewall, wherein a slope of the second surface region is greater than that of the first surface region.

11. The semiconductor memory device according to claim 10, wherein the non-planar top surface further comprises a third surface region connecting the second surface region with the outer sidewall, wherein the second surface region, the third surface region and the outer sidewall constitute a step structure.

* * * * *